(12) United States Patent
Ilic et al.

(10) Patent No.: US 12,713,836 B2
(45) Date of Patent: Aug. 18, 2026

(54) APPARATUS AND METHOD FOR SUPERCONDUCTING DIODE

(71) Applicants: CONSIGLIO NAZIONALE DELLE RICERCHE, Rome (IT); UNIVERSITY OF JYVASKYLA, University of Jyväskylä (FI); UNIVERSIDAD DEL PAÍS VASCO/EUSKAL HERRIKO UNIBERTSITATEA, Leioa (ES)

(72) Inventors: Stefan Ilic, Madrid (ES); Fernando Sebastian Bergeret, Donostia-San Sebastián (ES); Pauli Virtanen, University of Jyväskylä (FI); Tero Heikkilä, University of Jyväskylä (FI); Elia Strambini, Rome (IT); Francesco Giazotto, Rome (IT); Maria Spies, Rome (IT)

(73) Assignees: CONSIGLIO NAZIONALE DELLE RICERCHE, Rome (IT); UNIVERSITY OF JYVASKYLA, University of Jyväskylä (FI); UNIVERSIDAD DEL PAÍS VASCO/EUSKAL HERRIKO UNIVERTSITATEA, Leioa (DK)

( * ) Notice: Subject to any disclaimer, the term of this patent is extended or adjusted under 35 U.S.C. 154(b) by 363 days.

(21) Appl. No.: 18/291,379

(22) PCT Filed: Jul. 23, 2021

(86) PCT No.: PCT/IT2021/000038
§ 371 (c)(1),
(2) Date: Jan. 23, 2024

(87) PCT Pub. No.: WO2023/002513
PCT Pub. Date: Jan. 26, 2023

(65) Prior Publication Data

US 2024/0365674 A1 Oct. 31, 2024

(51) Int. Cl.
*H10N 50/10* (2023.01)
*H10N 50/85* (2023.01)
*H10N 60/10* (2023.01)

(52) U.S. Cl.
CPC ............. *H10N 50/10* (2023.02); *H10N 50/85* (2023.02); *H10N 60/128* (2023.02)

(58) Field of Classification Search
CPC ....... H10N 50/10; H10N 60/128; H10N 50/85
See application file for complete search history.

(56) References Cited

U.S. PATENT DOCUMENTS

2005/0092981 A1* 5/2005 Hunt .................. H10N 60/0941 257/31
2020/0227617 A1* 7/2020 Giazotto ............. H03K 19/195

FOREIGN PATENT DOCUMENTS

WO 2019038409 A1 2/2019

OTHER PUBLICATIONS

European Patent Office, International Search Report, Application No. PCT/IT2021/000038, mailed Jun. 7, 2022, 4 pages.

(Continued)

*Primary Examiner* — Norman D Richards
*Assistant Examiner* — Sean Ayers Winters
(74) *Attorney, Agent, or Firm* — Ziegler IP Law Group, LLC.

(57) ABSTRACT

Disclosed is an apparatus and a method. Spin-splitting is induced at a superconductor and spin-polarization facilitated for tunneling across a tunnel barrier so that electric current across the tunnel barrier between a conductor and the superconductor flows primarily in one direction.

12 Claims, 4 Drawing Sheets

(56) References Cited

OTHER PUBLICATIONS

European Patent Office, Written Opinion of the International Searching Authority, Application No. PCT/ IT2021/000038, mailed Jun. 7, 2022, 6 pages.

Giazotto et al. "Very large thermal rectification in ferromagnetic insulator-based superconductiong tunnel junctions" Applied Physics Letters, American Institute of Physics, vol. 116, No., 19, May 11, 2020, ISSN: 0003-6951, DOI: 10.1063/5.0010148, 6 pages.

Heikkila et al., "Thermal, electric and spin transport in superconductor/ferromagnetic-insulator structures" Progress in Surface Science 94, ARXIV.org, https://doi.org/10.1016/j.progsurf.2019.100540, Feb. 21, 2019, 57 pages.

Kolenda et al. "Thermoelectric effects in superconductor-ferromagnet tunnel junctions on europium sulfide", Physical Review B, published Jun. 7, 2017, DOI: 10.1103/PhysRevB.95.224505, 5 pages.

Tedrow et al. "Spin Polarization of Electrons Tunneling from Films of Fe, Co, Ni, and Gd" Physical Review B, vol. 7, No. 1, Jan. 1, 1973, ISSN: 0556-2805, DOI: 10.1103/PhysRevB.7.318, 9 pages.

* cited by examiner

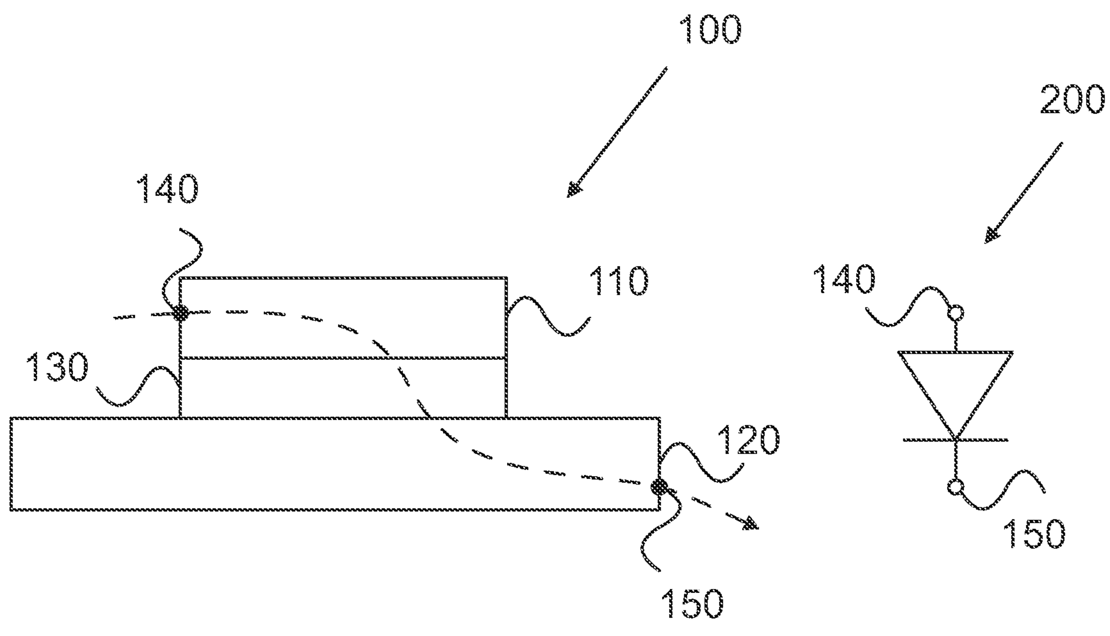
FIG. 1a
FIG. 1b
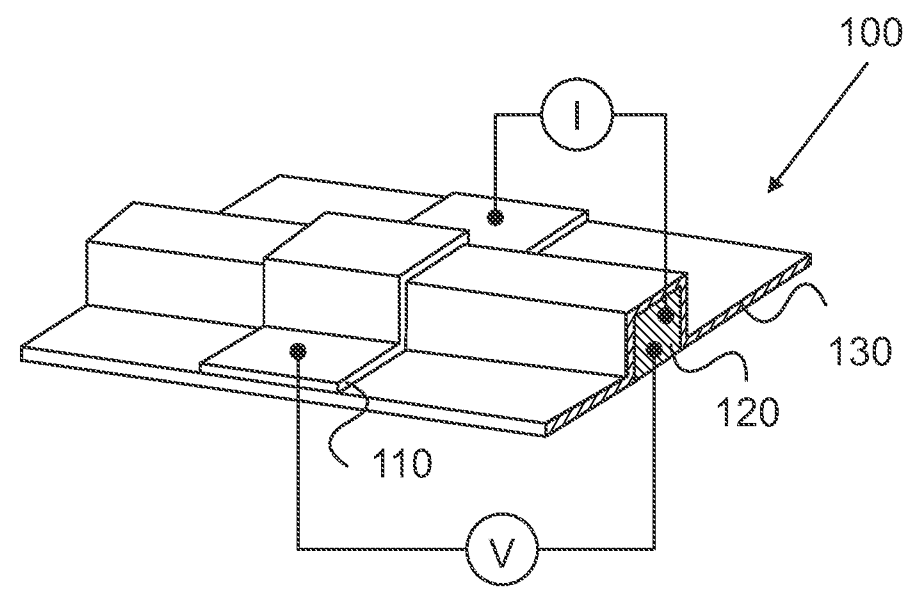
FIG. 2

APPARATUS AND METHOD FOR SUPERCONDUCTING DIODE

FIELD

The present disclosure relates to superconducting electronics. In particular, the disclosure relates to sub-millimeter or even sub-micron scale electronics, such as nanoelectronics.

BACKGROUND

Nanoelectronics refers to the use of nanotechnology in electronic components. The term covers a diverse set of devices and materials, with the common characteristic that they are so small that interatomic interactions and/or quantum mechanical properties affect their performance. Nanoelectronics devices may have one or more critical dimensions with a size range between 1 nm and 100 nm. Nanoelectronics are sometimes considered as disruptive technology because present devices are significantly different from traditional transistors. The search for material and structural combinations providing the best performances for the required application is continuously ongoing.

OBJECTIVE

An objective is to provide novel electronic components that may themselves open possibilities for new applications.

SUMMARY

In accordance with the present disclosure, it has been found that a tunnel barrier with a superconductor can be utilized for providing a direction-selective structure for electric current transport. This can be achieved when electric current transport across the tunnel barrier is spin-polarized by inducing spin-splitting to the superconductor in the vicinity of the tunnel barrier. This can be utilized to provide devices where electric current can be directed to flow primarily in one direction, or direction-selective electric transport devices, such as current limiters.

According to a first aspect, an apparatus comprises a first conductor, a second conductor and a tunnel barrier. The tunnel barrier is coupled between the first conductor and the second conductor to form a tunnel junction. The first conductor or the second conductor is a superconductor (the other conductor may herein be referred as "the other conductor"). The apparatus is configured for spin-splitting to be induced at the superconductor at the tunnel junction and tunneling across the tunnel barrier to be spin-polarized. The configuration allows electric current transport across the tunnel barrier to become direction-selective. In particular, this applies to the quasiparticle current at the superconductor, so that it can be utilized for direction-selective current transport. The configuration allows electric current across the tunnel barrier to flow primarily in one direction, making it attractive for various applications.

In an embodiment, the tunnel barrier comprises a magnetic insulator, such as a ferromagnetic insulator, for inducing spin-splitting at the superconductor and spin-polarizing tunneling across the tunnel barrier. This allows the tunnel barrier itself to provide the effects required for the direction-selective operation. The other conductor may be a magnetic or non-magnetic conductor, in particular a ferromagnetic or a non-ferromagnetic conductor. Furthermore, it allows the spin-splitting to be provided without an external magnetic field so that the apparatus may be provided as a passive component. In a further embodiment, the magnetic insulator is a europium chalcogenide, such as EuS or EuO. This may provide an enhanced spin-polarization for the tunneling in compartison to a generic magnetic insulator, in particular in the case of EuO, and/or simplified manufacturing, in particular in the case of EuS.

In an embodiment, the apparatus comprises a magnetic insulator, such as a ferromagnetic insulator, coupled to the superconductor in the vicinity of the tunnel barrier for inducing spin-splitting at the superconductor. The magnetic insulator can thus be separate from the tunnel barrier, for example provided as a separate material layer. This allows the spin-splitting to be induced separately from the tunnel barrier. The tunnel barrier may be magnetic or non-magnetic, in particular ferromagnetic or non-ferromagnetic. The embodiment can also allow the spin-filtering to be provided without an external magnetic field so that the apparatus may be provided as a passive component.

In an embodiment, the first conductor or the second conductor is a magnetic conductor, such as a ferromagnetic conductor, for spin-polarized tunneling across the tunnel barrier. This allows the tunneling to be spin-polarized irrespective of the tunnel barrier. The tunnel barrier may be magnetic or non-magnetic, in particular ferromagnetic or non-ferromagnetic. This embodiment may also be used in conjunction with the previous and/or the following embodiments to provide both the spin-polarization and the spin-splitting. As one of the first and the second conductor is a magnetic conductor, the other would then be the superconductor.

In an embodiment, the apparatus comprises a magnetic field generator for generating a magnetic field for inducing spin-splitting at the superconductor. This allows the spin-splitting to be induced without a separate structure, such as a magnetic structure, at the tunnel junction, and provides a further alternative to be used independently or in conjunction with the magnetic tunnel barrier and/or the magnetic insulator for the spin-splitting as described above. It can also be used in conjunction with the magnetic conductor. The magnetic field is an external magnetic field and it may be provided as a temporary, or a transient, magnetic field. This also allows the magnetic field to be utilized as a switch for switching the apparatus between a direction-selective state and a non-direction selective-state. The apparatus and the magnetic field generator may be configured accordingly. In a further embodiment, the magnetic field generator is configured for generating the magnetic field substantially perpendicular to the flow direction of the electric current across the tunnel barrier. This allows the spin-splitting to be optimized for improving the direction-selective transport across the tunnel barrier. This may be used, in particular, when the magnetic material providing the spin-polarization, such as the tunnel barrier and/or the magnetic conductor, is polarized in-plane.

In an embodiment, the apparatus is configured for responding to a first external magnetic field so that the electric current across the tunnel barrier flows in a first direction and to a second external magnetic field so that the electric current across the tunnel barrier flows in a second direction, opposite to the first direction. This can be done, when the second external magnetic field changes a polarization of the apparatus with respect to the polarization of the magnetic body in presence of the first external magnetic field. This allows the directionality of the apparatus, i.e. the preferred direction of current flow across the tunnel barrier, to be changed during the operation of the apparatus. The polarization may correspond to a polarization of one or more magnetic bodies of the apparatus, such as the tunnel barrier and/or the other conductor, facilitating the spin-splitting and/or the spin-polarization. In an embodiment, the tunnel junction is formed as a layered structure with the first conductor stacked on the second conductor with the tunnel barrier in between. This allows effective fabrication and configuration of the structure. In a further embodiment, the first conductor is the superconductor allowing the superconductor to be formed as a topmost structure.

In an embodiment, the apparatus comprises two or more terminals for facilitating direction-selective conduction of electric current. At least one of the terminals may be provided at the first conductor or the second conductor for providing electric current to the apparatus. Also, a terminal of the two or more terminals may be provided at the first conductor or the second conductor for providing electric current from the apparatus in a direction-selective manner, or primarily in one direction. In a first embodiment, the apparatus comprises a first terminal provided at the first conductor and a second terminal provided at the second conductor for conducting electric current between the first terminal and the second terminal. This conducting can thus be in a direction-selective manner, or primarily in one direction. In a second embodiment, the apparatus comprises a first terminal provided at a first contact point of the second conductor and a second terminal provided at a second contact point of the second conductor for providing an electric current, which may in particular be an alternating current, between the first terminal and the second terminal. The tunnel junction would then be located between the first contact point and the second contact point for rectifying electric current between the first terminal and the second terminal. The third terminal may be provided at the first conductor for providing a rectified current and/or voltage from the apparatus. According to both of the first and the second alternative, for the superconductor, the electric current can be conducted as quasiparticle current. In a further embodiment, the first conductor is the superconductor allowing the rectified current and/or voltage to be provided from a quasiparticle current.

A diode can be a non-linear and nonreciprocal circuit in which a lack of spatial inversion symmetry provides a direction-selective electron transport, which may also be called rectification. Diodes can be used as key elements for electronics, optics, and/or detection. In the long history of diodes, the material search for this symmetry breaking has been mainly focused on semiconducting and metallic junctions. However, owing to their large energy gap, semiconductors cease to work at the sub-Kelvin temperatures relevant for emerging cryogenic electronics and ultrasensitive detection, especially at sub-THz frequencies.

One example of a low-dimensional structure that could be proposed for solving such a problem can be provided by quantum dots, which may exhibit current rectification. Yet, the electron-hole symmetry in quantum dots can be tuned only within the level of a single quantum channel, which is why the impedance of such systems tends to be high, and the rectified currents thereby very low.

The solution, such as the aspects and embodiments, described herein provides a structure utilizing a superconductor. This has been found to allow the realization of a diode, such as a cryogenic diode. The use of a superconductor allows utilizing its intrinsic low impedance and the superconducting gap, the energy scales of which are smaller (~meV) in comparison to those of semiconductors (~eV). However, the implementation of a superconducting diode is not straightforward, since it requires breaking of the electron-hole symmetry, whereas the superconducting state is electron-hole symmetric by default. For a superconducting diode, in accordance with the present disclosure, the electron-hole symmetry breaking can be achieved by combining spin-polarization (which may also be referred to as "spin-filtering") for electric transport across the tunnel barrier and spin-splitting for the superconductor at the tunnel junction. Such a diode can operate even in the absence of an external magnetic field, support continuous current values, and rectify quasiparticle currents, rather than supercurrents.

As exemplified above, the spin-splitting may be induced into the superconductor by various ways, for example by an external magnetic field and/or by exchange interaction between the superconductor and a magnetic material in the vicinity of the superconductor, for example the tunnel barrier and/or a separate magnetic body such as the separate magnetic insulator exemplified above. The relative magnitude of the exchange interaction and the spin polarization may be used for determining a preferred direction for the electric current transport across the tunnel barrier.

According to a second aspect, a diode is provided. The diode comprises a first terminal and a second terminal. It also comprises the apparatus according to the first aspect or any of its embodiments, alone or in any combination. The first terminal is provided at the first conductor and the second terminal is provided at the second conductor for conducting electric current between the first terminal and the second terminal. This conducting can thus be in a direction-selective manner, or primarily in one direction. For the superconductor, the electric current can be conducted as quasiparticle current. The diode may be used at a lower voltage and thereby at lower dissipation levels than conventional semiconductor-based diodes.

According to a third aspect, a rectifier is provided. The rectifier comprises a first terminal, a second terminal and a third terminal. It also comprises the apparatus according to the first aspect or any of its embodiments, alone or in any combination. The first terminal is provided at a first contact point of the second conductor and the second terminal is provided at a second contact point of the second conductor for providing an electric current, which may in particular be an alternating current, between the first terminal and the second terminal. The tunnel junction may be located between the first contact point and the second contact point for rectifying electric current between the first terminal and the second terminal. The third terminal may be provided at the first conductor for providing a rectified current and/or voltage from the apparatus. For the superconductor, the rectified current and/or voltage can be provided from a quasiparticle current.

According to a fourth aspect, a method for facilitating direction-selective, or primarily one-directional, conduction of electric current is disclosed. The method comprises facilitating spin-splitting at a superconductor and spin-polarization for tunneling across a tunnel barrier. This can be performed so that electric current across the tunnel barrier between a conductor and the superconductor becomes direction-selective, or flows primarily in one direction. Using this method, a diode and/or a rectifier, for example according to the second and the third aspect may be provided, including the apparatus according to the first aspect or any of its embodiments, alone or in any combination.

It is to be understood that the aspects and embodiments described above may be used in any combination with each other. Several of the aspects and embodiments may be combined together to form a further embodiment of the invention.

The present solutions allow providing electric current rectification for the quasiparticles of the superconductor, in contrast to rectification of Cooper pairs i.e. the supercurrent. The solution can take advantage of the magnetic proximity effect on a superconductor and a spin-split density of states. The solutions are not restricted to any specific current range only and can be made to function with continuous electric current values. They can also be provided with reduced impedance. The solutions may be provided utilizing low-dimensional structures. Any solutions disclosed herein may be configured for operation at cryogenic temperatures, or for sub-Kelvin temperatures in particular. They may be configured for operation at any temperature below the critical temperature of the superconductor. Thereby, the solutions can also be provided compatible with superconducting electronics and already existing fabrication technologies. The apparatus according to the first aspect, the diode according to the second aspect and the rectifier according to the third aspect may be provided as a passive electronic component. Any of the aspects and the embodiments may be provided as or for a nanoelectronics device. They may be provided, for example, as a part of a detector with improved sensitivity, for example at temperatures where conventional electric components such as diodes fail to operate. The present solutions may also allow improved energy efficiency and/or operating frequency. They may be utilized at mixers, reverse current regulators, voltage clamping and passive superconductive electronics, for example.

BRIEF DESCRIPTION OF THE DRAWINGS

The accompanying drawings, which are included to provide a further understanding and constitute a part of this specification, illustrate examples and together with the description help to explain the principles of the disclosure. In the drawings:

FIG. 1*a* schematically illustrates an apparatus according to an example,

FIG. 1*b* illustrates a diode according to an example.

FIG. 2 illustrates an apparatus according to an example in a perspective view, FIG. 3*a,b* schematically illustrate an apparatus according to another example.

Figure 3A:
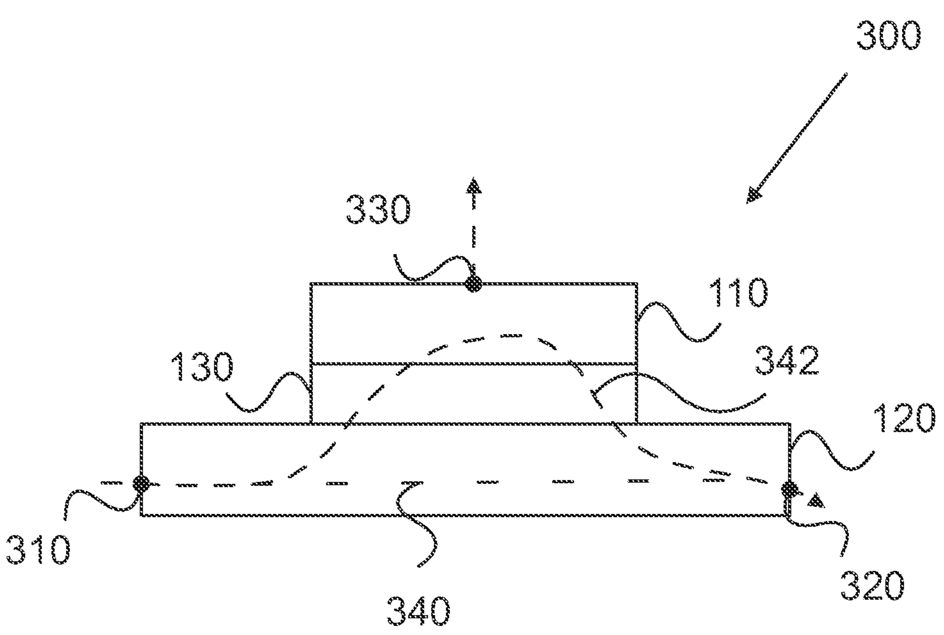

Like references are used to designate equivalent or at least functionally equivalent parts in the accompanying drawings.

DETAILED DESCRIPTION

The detailed description provided below in connection with the appended drawings is intended as a description of examples and is not intended to represent the only forms in which the example may be constructed or utilized. However, the same or equivalent functions and structures may be accomplished by different examples.

FIG. 1 shows an example of an apparatus 100 according to an example. The apparatus comprises a first conductor 110 and a second conductor 120. At least one of the first conductor and the second conductor is a superconductor, for example an aluminum superconductor. In general, the superconductor may be of any superconducting material, including for example: Al, Ti, V, NbN and Nb. The superconductor is superconducting at least in the operating temperature of the apparatus but may naturally be superconducting also at an extended temperature range. The superconductor may be a low-temperature superconductor. It may be of material, which becomes superconductive at a cryogenic temperature, for example below 10 Kelvin. The superconductor may be formed as a layer of superconducting material. The other conductor of the first and the second conductor may also be a superconductor, in which case any of the above alternatives regarding the properties of the superconductor may apply also to the other conductor. The properties may be the same or different for the two superconductors. For example, they may be of same or different material.

The other conductor of the first and the second conductor may also be non-superconducting conductor, at least in the operating temperature of the apparatus, for example a copper conductor. In general, the other conductor may be of any electrically conducting material. It may be magnetic, in particular ferromagnetic, for example of Co, Fe, Ni, or Gd. It may also be non-magnetic, in particular non-ferromagnetic, for example of: Cu, AlMn, Au, Ag, Pd or Pt. The other conductor may be formed as a layer of electrically conducting material.

The apparatus 100 comprises a tunnel barrier 130, which is coupled between the first conductor 110 and the second conductor 120 to form a tunnel junction. The tunnel barrier allows physically separating the first conductor from the second conductor, thereby preventing direct electric conduction between the two, while still allowing quantum tunneling for electric conduction between them. For the superconducting, this may correspond in particular to quasiparticle tunneling. The tunnel barrier may be of electrically insulating material. In particular, it may comprise or consist of a magnetic insulator, in particular a ferromagnetic insulator, such as EuS, EuO or GnN. The tunnel barrier may be formed as a layer of electrically insulating material. In some embodiments, in particular when the other conductor is a magnetic conductor, the tunnel barrier may comprise or consist of a non-magnetic insulator, for example AlOx.

The apparatus is configured for spin-splitting to be induced at the superconductor at the tunnel junction and tunneling across the tunnel barrier to be spin-polarized so that electric current across the tunnel barrier flows in a direction-selective manner or primarily in one direction. For the superconductor, this electric current may correspond to quasiparticle current. Correspondingly, the spin-splitting may correspond to a split in the quasiparticle density of states for the superconductor so that the superconducting density of states for one spin state, such as a spin-up state, is different from the quasiparticle density of states for an opposite spin state, such as spin-down state. Since the quasiparticle density of states for a superconductor can comprise large peaks, such spin-splitting may markedly affect the electric transport properties for the superconductor. It has been found that, since the superconductor comprises an energy gap and since the tunneling across the tunnel barrier is spin-polarized, electric current transport in one direction across the tunnel barrier can be favored with respect to electric current transport in the opposite direction.

The spin-splitting may be provided by one or more permanently magnetic bodies, which may be located in the vicinity of the tunnel barrier, and/or by an external magnetic field, which may be a temporary, or a transient, magnetic field. The spin-polarization for tunneling may be provided by one or more magnetic bodies, such as the tunnel barrier and/or the other conductor comprising or consisting of a magnetic material. The magnetic material may be ferromagnetic. The spin-splitting and the spin-polarization for tunneling may even be provided by the same magnetic body, such as the tunnel barrier being magnetic or ferromagnetic, such as a ferromagnetic insulator. However, the spin-splitting may also be provided by a magnetic body separate from the tunnel barrier. It may be separately coupled to the superconductor, for example as an additional material layer. In an embodiment, the magnetic body is a magnetic insulator, in particular a ferromagnetic insulator such as a europium chalcogenide, e.g. EuS and/or EuO.

The apparatus 100 may comprise a first terminal 140 and a second terminal 150. This can be used for facilitating direction-selective conduction of electric current through tunnel barrier 130. The first terminal may be provided at the first conductor 110 and the second terminal may be provided at the second conductor 120 for receiving electric current to the apparatus and providing electric current from the apparatus in a direction-selective manner, or primarily in one direction. This allows realizing a diode. Correspondingly, the apparatus may be provided as a diode 200, for example as illustrated in FIG. 1*b*. The diode of FIG. 1*b* is illustrated side-to-side with the apparatus of FIG. 1*a* to show how an electric current can be conducted in a direction-selective manner from the first terminal 140 to the second terminal 150 in both cases. The preferred direction is not necessarily that from the first conductor 110 to the second conductor 120. The apparatus and the diode may well be configured for the preferred direction to be from the second terminal to the first terminal, in which case the sign for the diode 200 in FIG. 1*b* may be flipped upside down. Correspondingly, the apparatus may be configured for the preferred direction to be either from the superconductor or to the superconductor. The configuration, and thereby the preferred direction, may be dependent on the relative strength of the spin-polarization and the spin-splitting.

The apparatus 100 may be specifically configured for changing its directionality on the fly so that it can be direction-selective in favor of both of the opposite directions across the tunnel barrier during its operation, for example in response to an external magnetic field. The apparatus may be configured for responding to a first external magnetic field so that the electric current across the tunnel barrier flows primarily in a first direction and to a second external magnetic field so that the electric current across the tunnel barrier flows primarily in a second direction. The first external magnetic field may here be opposite to the second external magnetic field. The first direction may be opposite to the second direction. The apparatus may comprise one or more magnetic field generator for providing the first and/or the second magnetic field. The generator may be configured for switching between the two directionalities, which may be done automatically. The apparatus, and the magnetic field generator, may be configured for changing the polarization of a magnetic body facilitating the spin-splitting and/or the spin-polarization with respect to the polarization in presence of the first external magnetic field. The magnetic body may be one or more of the tunnel barrier, the other conductor and the magnetic body separate from the tunnel barrier, in any combination. As an example, the apparatus may comprise two such magnetic bodies, in which case the apparatus may be configured for changing the polarization of one of these bodies with respect to the other for changing the directionality. The strength of the first and/or the second magnetic field may be selected accordingly. The directionality of the apparatus, i.e. the preferred direction of current flow across the tunnel barrier, to be changed during the operation of the apparatus.

An electric current to be transmitted through the tunnel barrier may be provided by an electric current source, which may be part of the apparatus 100 or separate from it. Similarly, the electric current provided in a direction-selective manner from the tunnel barrier may be provided to one or more devices and/or electric circuits utilizing the electric current, and these device(s) and/or electric circuits may be part of the apparatus or separate from it.

FIG. 2 illustrates an apparatus 100 according to an example in a perspective view. The tunnel junction may be formed as a layered structure and/or as a thin-film structure. For example, the first conductor 110 and/or the second conductor 120, in particular the topmost of the two, may have thickness as their smallest dimension. The tunnel junction may be formed as a stacked structure. The apparatus 100 may comprise a substrate, on which the tunnel junction may be formed. The first conductor and/or the second conductor may be deposited on top of the substrate, directly or indirectly. The tunnel barrier 130 may be deposited as a layer partially or fully between the first conductor and the second conductor. The first conductor may be deposited partially or fully overlapping the second conductor or the second conductor may be deposited partially or fully overlapping the first conductor. The tunnel barrier may be formed together with the first conductor or the second conductor as a bilayer. The other conductor of the first conductor and the second conductor may then be deposited partially or fully on top of the bilayer. In an embodiment, the superconductor, which may have thickness as its smallest dimension, is deposited partially or fully on top of the conductor. The tunnel junction may thereby be formed with the first conductor, such as the superconductor, stacked on the second conductor with the tunnel barrier between the first conductor and the second conductor. In an alternative or an additional embodiment, the first conductor is aligned parallel or perpendicular with respect to the second conductor. Correspondingly, the tunnel junction may be provided as a crossbar stack.

As illustrated, a current may be transported, in a direction-selective manner, between the first conductor 110 and the second conductor 120. Similarly, a voltage can be generated and a voltage drop be measured between the first conductor and the second conductor. The leads for voltage measurement and current transport connected to the second conductor are illustrated on the same side of the second conductor in FIG. 2 with respect to the tunnel junction for clarity. In an actual measurement, the leads may also be connected to the second conductor at the opposite sides of the tunnel junction, which allows mitigating or removing an additional resistive part from the measurement, when measuring across the tunnel barrier.

Figure 3B:
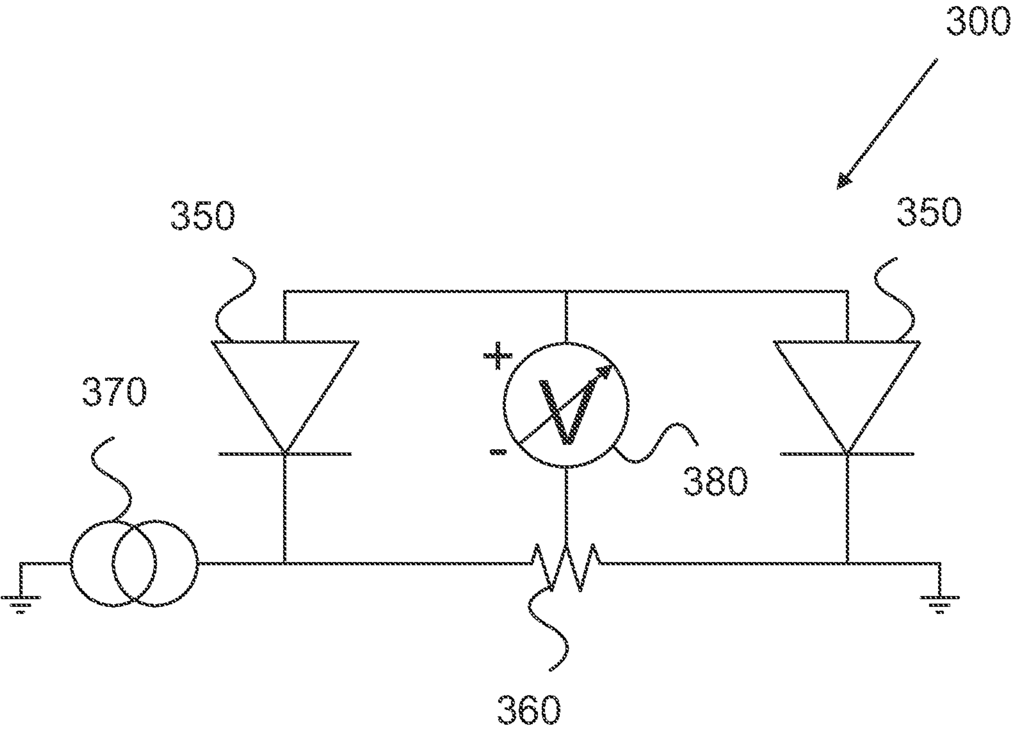

FIGS. 3*a* and 3*b* schematically illustrate an apparatus 300 according to another example. The apparatus may have any or all of the features of the apparatus 100 described above. However, it may be configured for rectifying an alternating current. Correspondingly, the apparatus may be provided as a rectifier.

As above, the apparatus 300 comprises the first conductor 110, the second conductor 120 and the tunnel barrier 130 forming the tunnel junction, involving the superconductor. Here, the apparatus may additionally comprise a first terminal 310 provided at a first contact point of the second conductor and a second terminal 320 provided at a second contact point of the second conductor for providing an electric current, which may in particular be an alternating current, between the first terminal and the second terminal. The tunnel junction may now be located between the first contact point and the second contact point for rectifying electric current between the first terminal 310 and the second terminal 320. The electric current may be provided by one or more electric current sources, such as alternating current sources, which may be part of the apparatus or separate from it. The electric current may be provided as a bias current.

The apparatus 300 may additionally comprise a third terminal 330, which may be provided at the first conductor 110 for providing a rectified current and/or voltage from the apparatus. The rectified current and/or voltage can be provided from a quasiparticle current. The rectified current and/or voltage may be provided to one or more devices and/or electric circuits utilizing the rectified current and/or voltage, and these device(s) and/or electric circuits may be part of the apparatus or separate from it. In an embodiment, the first conductor is the superconductor, for example a layered superconductor, which may be deposited on the tunnel barrier and the second conductor.

In FIG. 3*a*, it is illustrated how the rectification works according to an example. The electric current between the first terminal 310 and the second terminal 320 can give rise to electric currents 340 confined within the second conductor but also to electric currents 342 across the tunnel barrier 130. It has now been found that, due to the direction-selective nature of electric current transport across the tunnel barrier, a voltage can thus be generated across the tunnel barrier so that rectified current and/or voltage may be provided from the third terminal 330. As shown, the electric current, such as an alternating current, within the second conductor can be provided as a bias current transverse to the electric current transported across the tunnel barrier, thereby facilitating transverse rectification of electric current for providing the rectified current and/or voltage.

The apparatus 300 may thus be configured for performing transverse rectification of electric current, or quasiparticle current in particular. This can be done to provide a rectified current and/or voltage from the apparatus. The apparatus may be operated with a current bias $I_{Bias}$ applied along the second conductor, while a voltage drop may be measured across the tunnel barrier between the first and the second conductor. However, a signal injected to the apparatus 300 for rectification may be a voltage signal and/or a current signal. By the apparatus, the injected signal can be partially or fully decoupled from the rectified signal. At the tunnel junction, $I_{Bias}$ may partially flow in the first conductor and generate a voltage due to the non-symmetric response of the junction to the flowing current.

A possible implementation of the transverse rectification includes injecting an alternating current signal into the second conductor 120 and measuring a (DC) rectified voltage present at the third terminal 330 at the first conductor 110.

FIG. 3*b* further illustrates the apparatus 300 as a circuit diagram according to an example. The electric current, such as an alternating current, is provided to the second conductor from an electric current source 370, such as an alternating current source, which may be separate from the apparatus or a part of the apparatus. The tunnel junction is here represented by the diode signs 350, and the apparatus may alternatively be configured also for them to be upside down in contrast to how they are illustrated in the example. In the illustration, two diode signs are used since the electric current within the second conductor can flow parallel to the tunnel barrier, thereby allowing tunneling across the tunnel barrier to take place at multiple points between the first terminal and the second terminal. In practice, the tunneling can take place continuously along the tunnel barrier between the first terminal and the second terminal so that the number of diode signs in the illustration could be made infinite. Any electric resistance 360 within the second conductor along the tunnel barrier also means that tunneling at different points of the second conductor could be illustrated as separate branches in the circuit diagram, which may thus be repeated continuously along the second conductor between the first terminal and the second terminal. The rectified voltage can be measured between, the first and the second conductor, for example by a voltmeter 380.

Figure 4:
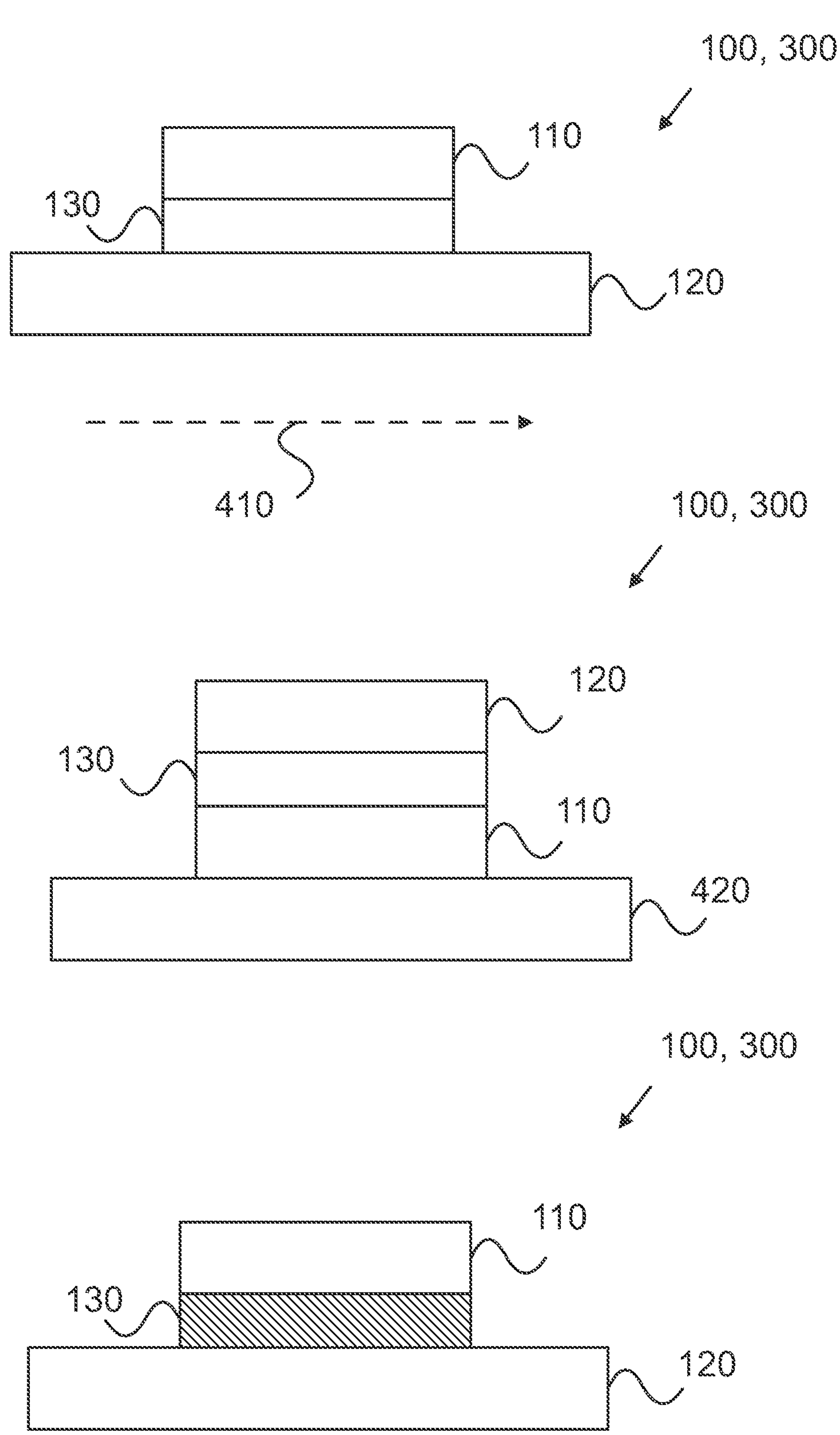
FIG. 4 illustrates examples of an apparatus.

FIG. 4 illustrates examples of an apparatus, which may be any of the apparatuses 100, 300 disclosed herein, including the diode and the rectifier.

In the topmost example, a magnetic field 410 is generated for inducing spin-splitting at the superconductor. This magnetic field is an external magnetic field, so that it can be provided as a temporary, or a transient, magnetic field. It can be provided by a magnetic field generator, for example the one or more magnetic field generators as mentioned above, which may be part of the apparatus or separate from it. The spin-splitting facilitates the transport of electric current across the tunnel barrier 130 becoming direction-selective. As an example, the electric current may flow primarily in one direction when the magnetic field is present in contrast to flowing substantially in both directions when the magnetic field is absent. The magnetic field may be utilized as a switch for switching the apparatus between a direction-selective state and a non-direction selective-state. The apparatus and the magnetic field generator may be configured accordingly. The magnetic field may be generated substantially perpendicular to the flow direction of the electric current across the tunnel barrier.

In an embodiment of this example, the first conductor 110 or the second conductor 120 may be the superconductor. The other conductor of the first and the second conductor may be a magnetic conductor, such as a ferromagnetic conductor, which may be non-superconducting, at least in the operating temperature of the apparatus 100, 300. The tunnel barrier 130 may comprise or consist of an insulator, which may be a non-magnetic insulator, such as a non-ferromagnetic insulator, for example when the magnetic conductor already provides the required spin-polarization for the transport across the tunnel barrier.

In the centermost example, the apparatus 100, 300 comprises one or more magnetic bodies 420, in particular ferromagnetic bodies, such as ferromagnetic insulators, coupled to the superconductor in the vicinity of the tunnel barrier for inducing spin-splitting at the superconductor. In the illustrated example, the first conductor 110 is the superconductor so the magnetic body may be coupled to the first conductor. The bodies are separate from the tunnel barrier 130, which may also be magnetic or ferromagnetic, for example a ferromagnetic insulator, but does not necessarily need to be as the spin-splitting required for direction-selective current transport across the tunnel barrier may be induced solely by the magnetic body or bodies, even without an external magnetic field. The other conductor, illustrated as the second conductor 120, may be a magnetic conductor, such as a ferromagnetic conductor, so that tunneling across the tunnel barrier is spin-polarized regardless of whether the tunnel barrier is magnetic or non-magnetic.

In an embodiment of this example, the superconductor is arranged between the tunnel barrier 130 and the magnetic body or bodies 420. In an alternative or additional embodiment, the tunnel junction is arranged on top of the magnetic body or bodies. The magnetic body or bodies may also be arranged on top of the superconductor, in the vicinity of the tunnel barrier for inducing the spin-splitting for the direction-selective transport of electric current across the tunnel barrier.

In the lowermost example, the tunnel barrier 130 comprises or consists of a magnetic insulator, such as a ferromagnetic insulator, for inducing spin-splitting at the superconductor and spin-polarized tunneling across the tunnel barrier. The tunnel barrier can thus provide both the spin-splitting and spin-polarization necessary for the direction-selective transport of electric current across the tunnel barrier. In particular, the magnetic insulator may comprise or consist of EuS and/or EuO allowing simplified manufacturing and/or improved spin-polarization.

As a specific example of a material combination, where no external magnetic field is necessarily required, the first conductor 110 may be an Al superconductor, the second conductor 120 a non-ferromagnetic, non-superconducting Cu conductor and the tunnel barrier 130 a ferromagnetic EuS insulator. As another such example, the first conductor may be an Al superconductor, the second conductor a ferromagnetic, non-superconducting Co conductor and the tunnel barrier a non-ferromagnetic $AlO_x$ insulator.

The physics yielding the direction-selective transport may be described as follows. They are here described in terms of being induced by the tunnel barrier being a (ferro)magnetic insulator, but may be correspondingly applied for any other ways of inducing the spin-splitting and spin-polarization as disclosed herein. The tunnel barrier, such as a layer of a ferromagnetic insulator, can induce a spin-splitting energy (h) in the superconductor through interface exchange interaction. The material can simultaneously cause a spin-polarization, or spin-filtering, (P) across the junction. The former can yield an opposite energy shift for the density of states at the superconductor, which may be described by Bardeen-Cooper-Schrieffer density of states, of the two spin species (e.g. up and down), while the latter allows forming a tunneling barrier with different heights for the two spin species. This twofold effect can be probed experimentally by measuring the differential conductance of the tunnel junction and leads to qualitative changes in the system's transport characteristics.

The spin-polarization (P) of the tunnel junction, for example one having a (ferro)magnetic insulator as the tunnel barrier and non-magnetic conductor as the other conductor, may be described, for example, by using a simple analytical model, which neglects spin-dependent scattering and orbital de-pairing. Within these approximations the electric current (I) tunneling across the junction may be simplified as a function of voltage (V) at temperature (T) in accordance with the following expression, where $k_B$ represents the Boltzmann constant and e the elementary charge:

$$I(V) = I_S\left(c^{cV/(k_B T)} - 1\right) + I_S\left(\cosh\left(\frac{cV}{k_B T}\right) - 1\right](P - 1)$$

This equation is composed of two elements. The first one represents the Shockley ideal diode equation and dominates when P is close to unity. It describes the asymmetric I(V) curves characteristic of diodes. The second contribution is the first correction to an ideal diode due to the non-ideal spin polarization. This yields the simple result for the rectification, $R=P\tanh[eV/(2k_BT)]$. The maximum rectification at $|eV| \geq 2k_BT$ may hence be dictated by the spin-filtering efficiency P.

The presence of the superconducting gap can be clearly recognized in a typical I(V) characteristic between the first terminal 140 and the second terminal 150 for the apparatus 100, as illustrated for example in FIG. 1*a*, with the absence of current flow at low bias, and an Ohmic behavior for relatively large voltage ($eV \sim \Delta$ and larger). In an intermediate voltage range, non-linearities and non-reciprocity may appear, which can become observable in the symmetric and antisymmetric parts of the I(V) characteristic. They may be defined as $I_{sym}=(I(V)+I(-V))/2$ and $I_{Anti\text{-}sym}=(I(V)-I(-V))/2$. The symmetric component $I_{Sym}(V)$ can become sizable, suggesting an efficient charge rectification, which may be equated with the capability to convert an AC input into a DC output signal. Rectification (R) of a circuit can be defined as the ratio between the difference of the forward and backward current divided by the sum of the two, $$R(V) = (I(V) - I(-V))/(I(V) + I(-V)) = I_{Sym}/I_{Antisym}.$$

For an ideal rectifier R=1, while for R=0 no rectification is present. In accordance with the present disclosure, a sizable rectification can be achieved in the intermediate voltage range ($eV \sim \Delta$). In a specific example, where a strong asymmetry is induced by the spin filtering, R can be maximized at a voltage below 1V, for example around 225-280 μV. Correspondingly, the apparatus 100 as described herein may be specifically configured for operation at a specified voltage range, for example below 1V. This range may be dependent on the magnitude of the energy gap of the superconductor.

For the apparatus 300 comprising the three terminals, as illustrated for example in FIG. 3*a*, the voltage generated across the tunnel barrier can be measured and represented by a symmetrized voltage $V_{sym}$, where the trivial Ohmic component originating in the first conductor may be discarded to emphasize the effect provided by the apparatus. A monotonic increase of $V_{sym}(I_{Bias})$ is visible and more pronounced at large fields due to the larger h and P of the junction. Notably, a sizable transverse rectification can be made present also at zero magnetic field, for example by the (ferro)magnetic tunnel barrier. This characteristic can be especially relevant for applications since no additional magnetic feed lines need to be integrated into the device. On the other hand, the spintronic nature of this effect can be confirmed for example by utilizing at an EuS tunnel barrier a coercive field (e.g. ~14 mT at base temperature) so that the rectified signal is not visible.

In general, the other conductor, i.e. the conductor not the superconductor, may be a magnetic conductor, in particular a ferromagnetic conductor, for spin-polarizing tunneling across the tunnel barrier. In an embodiment, the solution may be configured for operation at a temperature range below the critical temperature of the superconductor, for example at a temperature below half the critical temperature ($T_c/2$). It has been found that the apparatus can thus be robustly used with no crucial degradation of rectification.

Figure 5:
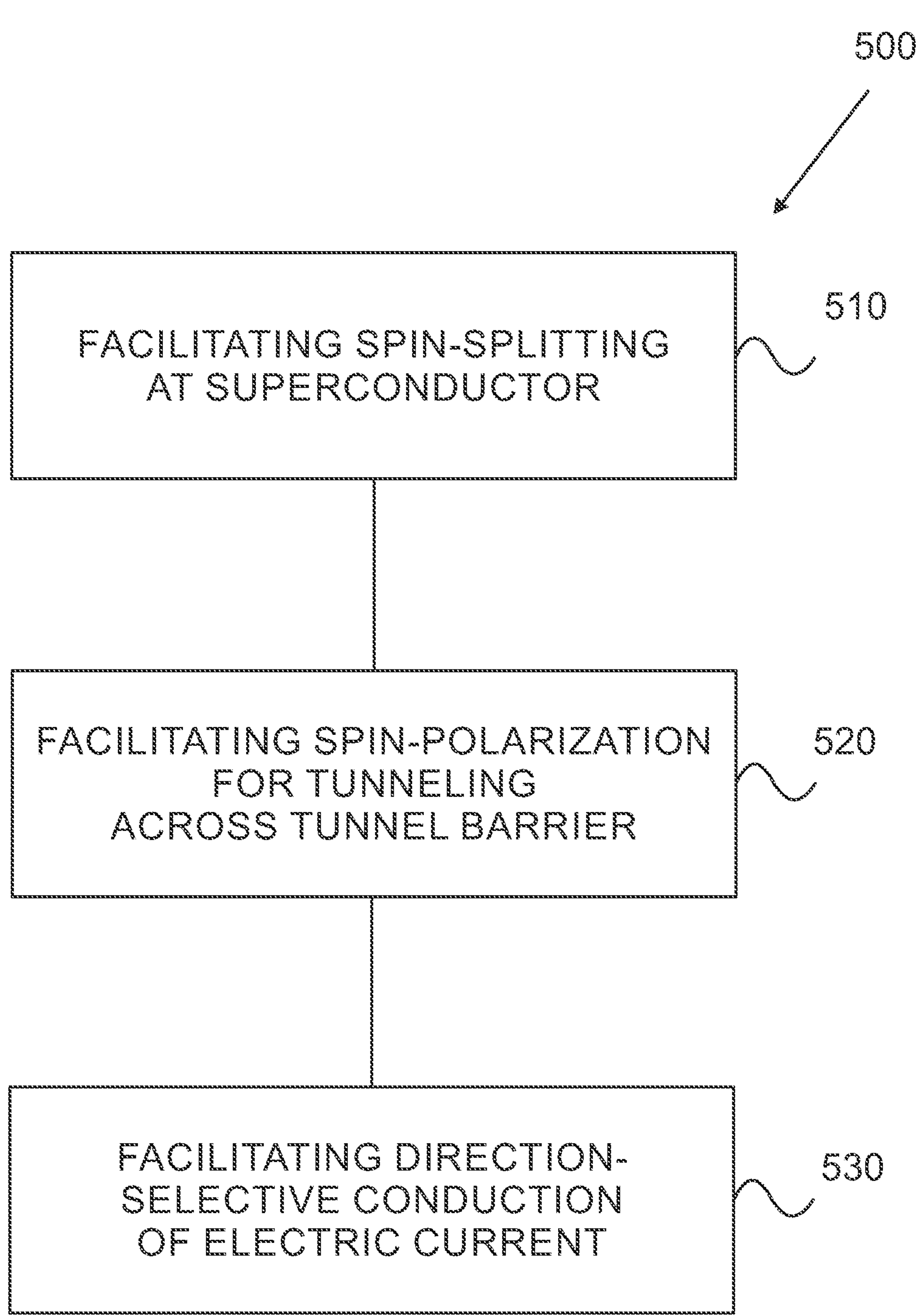
FIG. 5 illustrates a method according to an example.

FIG. 5 shows an example of a method 500, which may be used for facilitating direction-selective, or primarily one-directional, conduction of electric current. The method comprises several parts which may be performed independently from each other and/or in any order.

In particular, the method 500 comprises facilitating spin-splitting 510 at a superconductor and facilitating spin-polarization 520 for tunneling across a tunnel barrier. This can be done to facilitate 530 so that electric current across the tunnel barrier between a conductor and the superconductor flows in a direction-selective manner, or primarily in one direction. Any of the steps and/or apparatuses disclosed herein may be used in conjunction with the method.

The apparatuses disclosed herein may be configured as nanoelectronics devices. They may be configured for cryogenic operation. Similarly, the methods disclosed herein may be performed for nanoelectronics circuits. They may be performed at a cryogenic temperature.

Advantageous effects may be obtained from the superconducting nature of the solutions. The solutions allow high energy efficiency in terms of heat dissipated and absorbed energy, high operating frequency (for example up to one or more THz, e.g. 1-10 THz), compatibility with technologies based on superconducting materials and/or high integration potential. The solutions can be operated at cryogenic temperatures and they are therefore suitable for emerging cryogenic electronics and/or ultrasensitive detection. Moreover, operating temperature can be increased by using as the superconductor a superconductor with high critical temperature. The solutions may be operated without the use of an externally applied magnetic field. The solutions may be utilized with detector or the apparatuses may be or comprise a detector having detector capabilities such as sensitivities up to $\sim 2\times 10^3$ A/W or better, for example, and/or noise equivalent power down to $\sim 1\times 10^{-9}$ W/$\sqrt{\text{Hz}}$ or better, for example.

The different functions discussed herein may be performed in a different order and/or concurrently with each other.

Any references to a current may be understood as references to an electric current.

Any range or device value given herein may be extended or altered without losing the effect sought, unless indicated otherwise. Also any example may be combined with another example unless explicitly disallowed.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item may refer to one or more of those items.

The term 'comprising' is used herein to mean including the method, blocks or elements identified, but that such blocks or elements do not comprise an exclusive list and a method or apparatus may contain additional blocks or elements.

Numerical descriptors such as 'first', 'second', and the like are used in this text simply as a way of differentiating between parts that otherwise have similar names. The numerical descriptors are not to be construed as indicating any particular order, such as an order of preference, manufacture, or occurrence in any particular structure.

Although the invention has been described in conjunction with a certain type of apparatus and/or method, it should be understood that the invention is not limited to any certain type of apparatus and/or method. While the present inventions have been described in connection with a number of examples, embodiments and implementations, the present inventions are not so limited, but rather cover various modifications, and equivalent arrangements, which fall within the purview of the claims. Although various examples have been described above with a certain degree of particularity, or with reference to one or more individual embodiments, those skilled in the art could make numerous alterations to the disclosed examples without departing from the scope of this specification.

The invention claimed is:

1. An apparatus comprising:

a first conductor, a second conductor, and a tunnel barrier coupled between the first conductor and the second conductor to form a tunnel junction;

wherein only one of the first conductor and the second conductor is a superconductor and the apparatus is configured for spin-splitting to be induced at the superconductor at the tunnel junction and tunneling across the tunnel barrier to be spin-polarized so that electric current across the tunnel barrier flows primarily in one direction.

2. The apparatus according to claim 1, wherein the tunnel barrier comprises a magnetic insulator for inducing spin-splitting at the superconductor and spin-polarizing tunneling across the tunnel barrier.

3. The apparatus according to claim 2, wherein the magnetic insulator is a europium chalcogenide.

4. The apparatus according to claim 1, comprising a magnetic insulator coupled to the superconductor in the vicinity of the tunnel barrier for inducing spin-splitting at the superconductor.

5. The apparatus according to claim 1, wherein the first conductor or the second conductor is a magnetic conductor for spin-polarizing tunneling across the tunnel barrier.

6. The apparatus according to claim 1, comprising a magnetic field generator for generating a magnetic field for inducing spin-splitting at the superconductor.

7. The apparatus according to claim 6, wherein the magnetic field generator is configured for generating the magnetic field substantially perpendicular to the flow direction of the electric current across the tunnel barrier.

8. The apparatus according to claim 1, configured for responding to a first external magnetic field so that the electric current across the tunnel barrier flows primarily in a first direction and to a second external magnetic field so that the electric current across the tunnel barrier flows primarily in a second direction, opposite to the first direction.

9. The apparatus according to claim 1, wherein the tunnel junction is formed as a layered structure with the first conductor stacked on the second conductor with the tunnel barrier in between.

10. A diode comprising:

a first terminal, a second terminal, and an apparatus according to claim 1, wherein the first terminal is provided at the first conductor and the second terminal is provided at the second conductor for conducting electric current between the first terminal and the second terminal primarily in one direction.

11. A rectifier comprising:

a first terminal, a second terminal, a third terminal, and an apparatus according to claim 1, wherein the first terminal is provided at a first contact point of the second conductor and the second terminal is provided at a second contact point of the second conductor for providing an electric current between the first terminal and the second terminal;

wherein the tunnel junction is located between the first contact point and the second contact point for rectifying electric current between the first terminal and the second terminal and the third terminal is provided at the first conductor for providing a rectified current and/or voltage from the apparatus.

12. A method for facilitating primarily one-directional conduction of electric current, the method comprising facilitating spin-splitting at a superconductor and spin-polarization for tunneling across a tunnel barrier so that electric current across the tunnel barrier between a non-superconducting conductor and the superconductor flows primarily in one direction.

* * * * *